United States Patent
Takiguchi (12) 
(10) Patent No.: US 6,741,630 B2
(45) Date of Patent: May 25, 2004

(54) RIDGE WAVEGUIDE DISTRIBUTED FEEDBACK LASER

(75) Inventor: Tohru Takiguchi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/245,495

(22) Filed: Sep. 18, 2002

(65) Prior Publication Data

US 2003/0185263 A1 Oct. 2, 2003

(30) Foreign Application Priority Data

Feb. 16, 2002 (JP) ........................ 2002-086567

(51) Int. Cl.⁷ .............................. H01S 5/00; H01S 3/08
(52) U.S. Cl. .............................. 372/96; 372/43; 372/50; 372/102; 372/45
(58) Field of Search .............................. 372/96, 43, 45, 372/50, 102, 75

(56) References Cited

U.S. PATENT DOCUMENTS 6,072,812 A  6/2000 Eng

2002/0061046 A1 * 5/2002 Takiguchi et al. ............ 372/96

FOREIGN PATENT DOCUMENTS

| JP | 62-84583 | 4/1987 |
| JP | 11-97795 | 4/1999 |

OTHER PUBLICATIONS

Sudoh, Tsurugi K. et al., "Hightly Reliable 1.3–μm InGaAlAs MQW DFB Lasers", Proc. of Laser Conference, 2000, Tub6, pp. 55–56.

* cited by examiner

Primary Examiner—Paul Ip
Assistant Examiner—Armando Rodriguez
(74) Attorney, Agent, or Firm—Leydig, Voit & Mayer, Ltd.

(57) ABSTRACT

A ridge waveguide distributed feedback laser includes a p-type InGaAsP grating layer having a p-type carrier density ranging from $1.5 \times 10^{18}$ cm$^{-3}$ to $4.0 \times 10^{-3}$ cm$^{-3}$ and preferably from $2.0 \times 10^{18}$ cm$^{-3}$ to $3.0 \times 10^{18}$ cm$^{-3}$. In combination with such raised levels of p-type carrier density in the InGaAsP grating layer, the p-type carrier density may also be enhanced both in a p-type InP layer between the grating layer and a contact layer, and in another p-type InP layer between the grating layer and a quantum well active layer, the density ranging from $1.5 \times 10^{18}$ cm$^{-3}$ to $4.0 \times 10^{18}$ cm$^{-3}$ and preferably from $2.0 \times 10^{18}$ cm$^{-3}$ to $3.0 \times 10^{18}$ cm$^{-3}$.

8 Claims, 11 Drawing Sheets

RIDGE WAVEGUIDE DISTRIBUTED FEEDBACK LASER

BACKGROUND OF THE INVENTION

1. Field of the Invention

The present invention relates to a ridge waveguide distributed feedback (DFB) laser having a grating included in its ridge waveguide.

2. Background Art

Conventional ridge waveguide distributed feedback lasers using an n-type semiconductor substrate include an n-type first clad layer, an n-type second clad layer, an n-type light trap layer, a quantum well active layer, a p-type light trap layer, and a p-type clad layer formed successively on the n-type semiconductor substrate, the p-type clad layer being topped with a ridge waveguide. The ridge waveguide is made up illustratively of a p-type InGaAsP grating layer formed on a p-type InP layer, the p-type InGaAsP grating layer being topped with another p-type InP layer.

Figure 12:
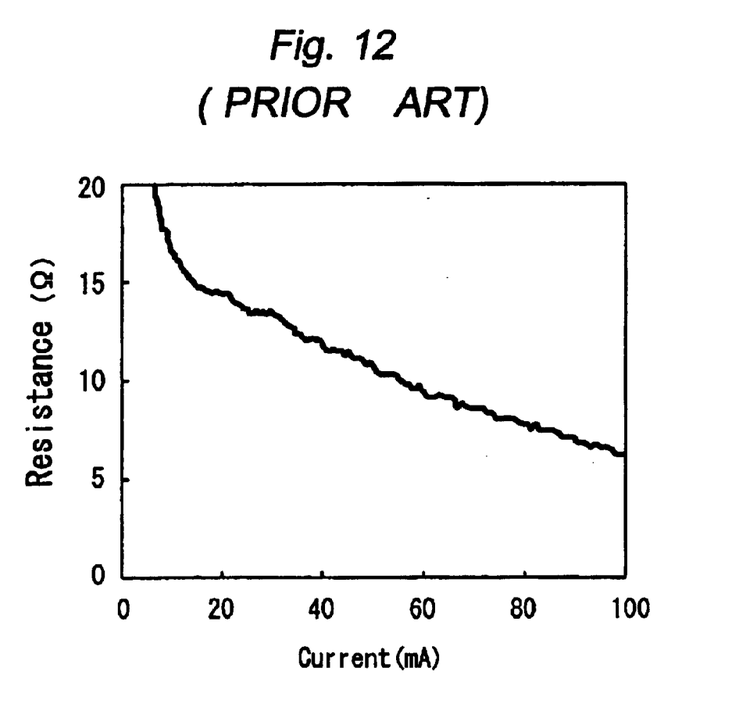
FIG. 12 shows a typical relationship between series resistance values and current values of the conventional ridge waveguide type distributed feedback laser.

FIG. 12 shows a typical relationship between series resistance values and current values of this kind of conventional ridge waveguide distributed feedback laser. The current values are those of an oscillating current that flows to an oscillating region, arid the resistance values are those of a resistor inserted in series with the oscillating current. This kind of conventional laser has a series resistance as high as 14 Ω relative to a current value of 20 mA. The reasons for this characteristic are explained below.

In such a conventional ridge waveguide distributed feedback laser, the ridge waveguide is constituted by forming a p-type InP layer topped with a p-type InGaAsP grating layer followed by burying growth of a p-type InP layer. During the burying growth, silicon (Si) piles up on regrown interfaces. The piled-up silicon, derived from the atmosphere or from water, behaves as an n-type dopant in p-type semiconductor layers. If the silicon pileup forms an n-type layer between the p-type InGaAsP grating layer on the one hand and the upper and lower p-type InP layers on the other hand, the interposed substance acts as a pnp junction conducive to higher resistance. This generally causes zinc (Zn) to be used as a p-type dopant in the p-type InGaAsP grating layer and the upper and lower p-type InP layers and to diffuse therefrom. The diffused zinc combines with the piled-up silicon and compensates the latter. As a result, the silicon no longer behaves as the n-type dopant.

In the laser structure described, the p-type InGaAsP grating layer is located immediately under the regrown interface. With this kind of conventional laser, the carrier density in the p-type InGaAsP grating layer is as low as $1\times10^{18}$ cm$^{-3}$ or less. That means the InGaAsP layer has a higher level of solid solubility of zinc than does the InP layer. This tends to cause zinc to diffuse from the p-type InP layer above the p-type InGaAsP grating layer into the InGaAsP grating layer, reducing the density of zinc immediately above the grating layer. As a result, the silicon pileup just above the p-type InGaAsP grating layer stays uncompensated by zinc; the remaining n-type layer then increases the resistance of the laser.

SUMMARY OF THE INVENTION

It is therefore an object of the present invention to overcome the above and other deficiencies of the prior art and to provide a ridge waveguide type distributed feedback laser which compensates piled-up silicon immediately above grating layers with zinc so as to reduce resistance of the laser significantly.

According to one embodiment of the present invention, a ridge waveguide type distributed feedback laser comprises a ridge waveguide, and a p-type InGaAsP grating layer having a carrier density ranging from $1.5\times10^{18}$ cm$^{-3}$ to $4.0\times10^{18}$ cm$^{-3}$ formed in the ridge waveguide. The p-type InGaAsP grating layer preferably has a carrier density ranging from $2.0\times10^{18}$ cm$^{-3}$ to $3.0\times10^{18}$ cm$^{-3}$.

In other embodiment of the present invention, the ridge waveguide type distributed feedback laser further comprises a p-type contact layer, and a p-type InP layer having a carrier density ranging from $1.5\times10^{18}$ cm$^{-3}$ to $4.0\times10^{18}$ cm$^{-3}$ formed interposingly between the p-type InGaAsP grating layer and the p-type contact layer.

The ridge waveguide type distributed feedback laser may comprises a quantum well active layer, and a p-type InP layer having a carrier density ranging from $1.5\times10^{18}$ cm$^{-3}$ to $4.0\times10^{18}$ cm$^{-3}$ formed interposingly between the p-type InGaAsP grating layer and the quantum well active layer.

The ridge waveguide type distributed feedback laser may comprises an upper and a lower p-type InP layer formed in a manner sandwiching the p-type InGaAsP grating layer therebetween, each of the upper and the lower p-type InP layers having a carrier density ranging from $1.5\times10^{18}$ cm$^{-3}$ to $4.0\times10^{18}$ cm$^{-3}$.

The p-type InGaAsP grating layer preferably has a carrier density ranging from $2.0\times10^{18}$ cm$^{-3}$ to $3.0\times10^{18}$ cm$^{-3}$, and the p-type InP layer preferably has a carrier density ranging from $2.0\times10^{18}$ cm$^{-3}$ to $3.0\times10^{18}$ cm$^{-3}$.

Other and further objects, features and advantages of the invention will appear more fully from the following description.

BRIEF DESCRIPTION OF THE DRAWINGS

The present invention will be more apparent from the following detailed description, when taken in conjunction with the accompanying drawings, in which.

DETAILED DESCRIPTION OF THE PREFERRED EMBODIMENTS

First Embodiment

Figure 1:
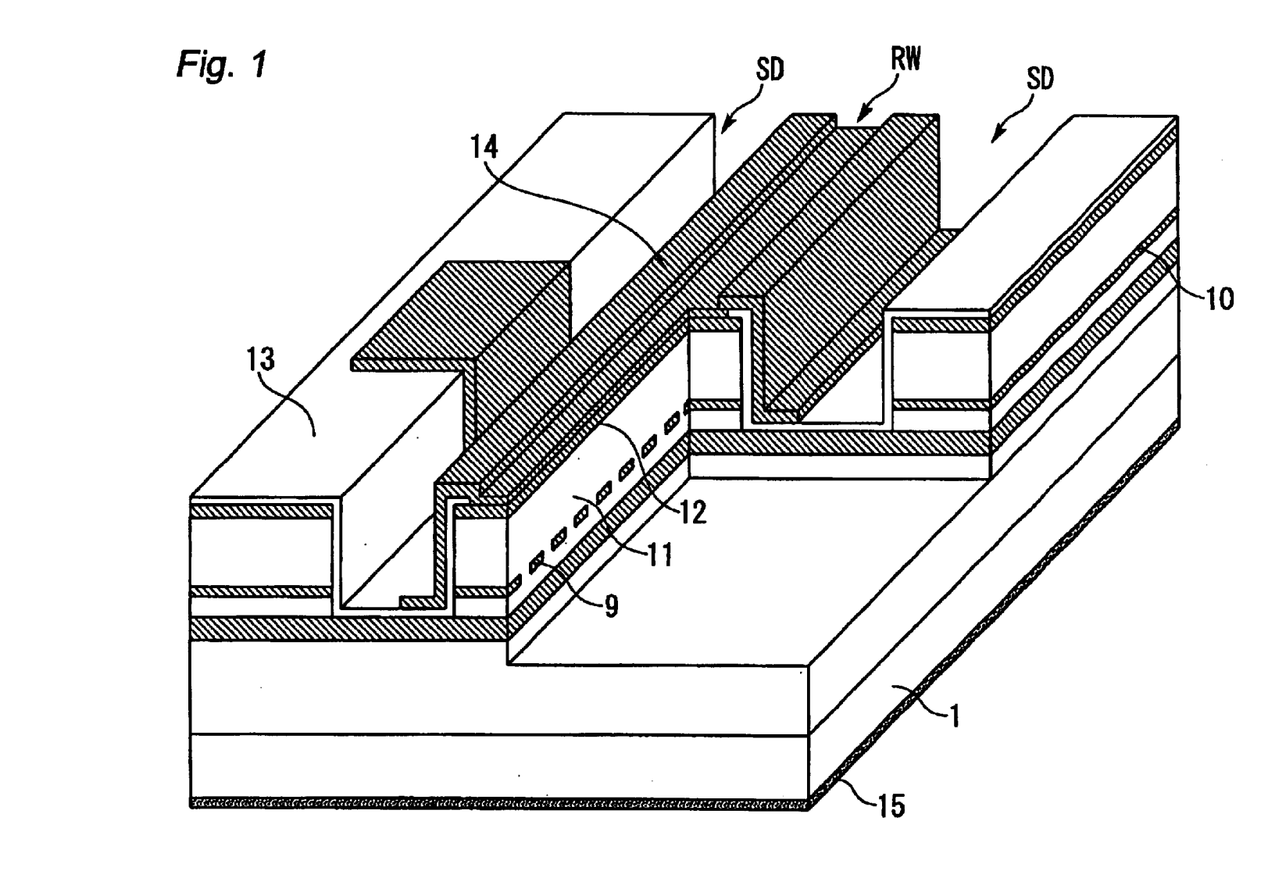
FIG. 1 is a partially cutaway perspective view of a ridge waveguide type distributed feedback (DFB) laser according to the present invention.
Figure 2:
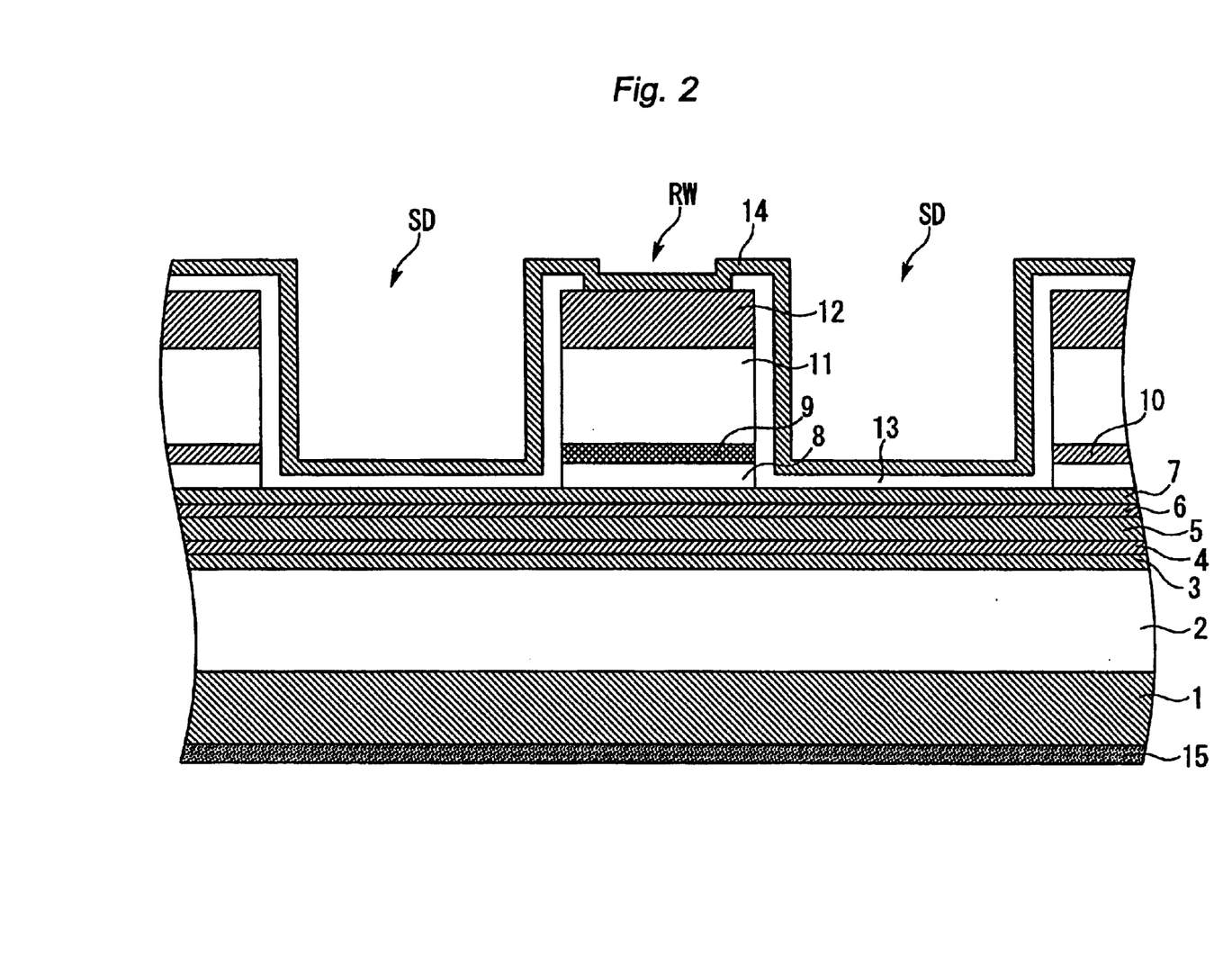
FIG. 2 is a cross-sectional view taken of a central portion of the ridge waveguide type distributed feedback laser according to the present invention.

FIG. 1 is a partially cutaway perspective view of a ridge waveguide type distributed feedback (DFB) laser practiced as a first embodiment of this invention. FIG. 2 is a cross-sectional view taken of a central portion of the laser practiced as the first embodiment.

This ridge waveguide type distributed feedback laser comprises illustratively an n-type semiconductor substrate such as an InP substrate 1. The n-type InP substrate 1 is square in shape and topped entirely with an n-type first clad layer 2. The n-type first clad layer 2 is illustratively an InP layer with a thickness of 1 µm and with an n-type carrier density of $1×10^{18}$ cm$^{-3}$. The top of the n-type first clad layer 2 is covered entirely with an n-type second clad layer 3. The n-type second clad layer 3 is illustratively AlInAs layer with a thickness of 0.1 µm and with an n-type carrier density of $1×10^{18}$ cm$^{-3}$. The top of the n-type second clad layer 3 is covered entirely with an n-type light trap layer 4. The n-type light trap layer 4 is illustratively an n-type AlGaInAs layer with a thickness of 0.1 µm and with an n-type carrier density of $1×10^{18}$ cm$^{-3}$.

The top of the n-type light trap layer 4 is covered entirely with a quantum well active layer 5. The quantum well active layer 5 is illustratively an AlGaInAs layer. The top of the quantum well active layer 5 is covered entirely with a p-type light trap layer 6 which is illustratively 0.1 µm thick and has a p-type carrier density of $1×10^{18}$ cm$^{-3}$. The top of the p-type light trap layer 6 is covered entirely with a p-type clad layer 7. The p-type clad layer 7 is illustratively a p-type AlInAs layer which is 0.1 µm thick and has a p-type carrier density of $1×10^{18}$ cm$^{-3}$.

Three parallel ridges are formed on the top of the p-type clad layer 7. The centrally located ridge constitutes a ridge waveguide RW. Between two adjacent ridges is a stripe ditch SD.

The bottom layer of each of the ridges including the ridge waveguide RW constitutes a p-type lower InP layer 8 that is formed over the p-type clad layer 7. The lower InP layer 8 is topped with a p-type InGaAsP layer 10 which occurs as a p-type InGaAsP grating layer 9 in the ridge waveguide RW. The p-type InGaAsP layers 9 and 10 are illustratively 0.06 µm thick each. The p-type InGaAsP grating layer 9 has p-type carrier densities ranging from $1.5×10^{18}$ cm$^{-3}$ to $4.0×10^{18}$ cm$^{-3}$, while the p-type InGaAsP layer 10 has a p-type carrier density of $1×10^{18}$ cm$^{-3}$. The carrier density of the p-type InGaAsP grating layer 9, preferably between $2.0×10^{18}$ cm$^{-3}$ and $3.0×10^{18}$ cm$^{-3}$, is set specifically to $2.5×10^{18}$ cm$^{-3}$ for the first embodiment.

The top of the p-type InGaAsP layers 9 and 10 is covered with a p-type upper InP layer 11 which is illustratively 1.5 µm thick and has a p-type carrier density of $1×10^{18}$ cm$^{-3}$. The upper InP layer 11 is topped with a p-type contact layer 12 which is illustratively a p-type InGaAs layer with a thickness of 0.1 µm and with a p-type carrier density of $1×10^{19}$ cm$^{-3}$.

The three ridges and the stripe ditches SD therebetween are all covered with an $SiO_2$ insulation film 13. On top of the ridge waveguide RW, contact holes are formed in the $SiO_2$ insulation film 13. The $SiO_2$ insulation film 13 is topped with a p-type electrode 14 of the laser. The p-type electrode 14, made illustratively of titanium (Ti)/gold (Au), is in ohmic contact with the contact layer 12 through the contact holes. Under the n-type substrate 1 is an n-type electrode 15 in ohmic contact with the substrate 1. The n-type electrode 15 is illustratively composed of gold/germanium/nickel/gold (Au/Ge/Ni/Au). FIG. 1 gives a partially cutaway view of a right-hand half of the central ridge constituting the ridge waveguide RW, a cross section of the ridge on the right-hand side of the ridge waveguide RW, and a partially cutaway view of a front half of some of the layers below the ridges.

Successive steps to manufacture the first embodiment of this invention will now be described. There are sixteen manufacturing steps including: a first step shown in FIG. 3A, a second step in FIG. 3B, a third step in FIGS. 4A and 4B, a fourth step in FIG. 4C, a fifth step in FIG. 4D, a sixth step in FIGS. 5A and 5B, a seventh step in FIGS. 5C, 5D and 5E, an eighth step in FIG. 6A, a ninth step in FIG. 6B, a tenth step in FIG. 7A, an eleventh step in FIG. 7B, a twelfth step in FIG. 8A, a thirteenth step in FIG. 8B, a fourteenth step in FIG. 9A, a fifteenth step in FIG. 9B, and a sixteenth step in FIG. 10.

Figure 3A:
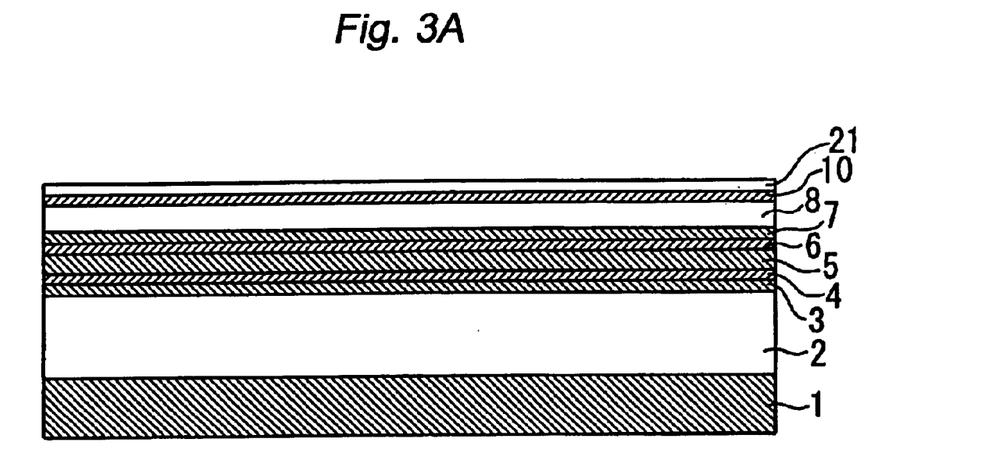
FIGS. 3A, 3B, 4A, 4B, 4C, 4D, 5A, 5B, 5C, 5D, 5E, 6A, 6B, 7A, 7B, 8A, 8B, 9A, 9B and 10 show manufacturing steps to manufacture the ridge waveguide type distributed feedback laser according to the present invention.

In the first step depicted in FIG. 3A, an MOCVD process is used illustratively to stack an n-type InP first clad layer 2, an n-type AlInAs second clad layer 3, an n-type AlGaInAs light trap layer 4, an AlGaInAs quantum well active layer 5, a p-type AlGaInAs light trap layer 6, a p-type AlInAs clad layer 7, a p-type lower InP layer 8, a p-type InGaAs layer 10, and a p-type InP layer 21 onto the n-type substrate 1 successively by growth. On this wafer, markers are etched where appropriate for subsequent alignment in photolithography.

Figure 3B:
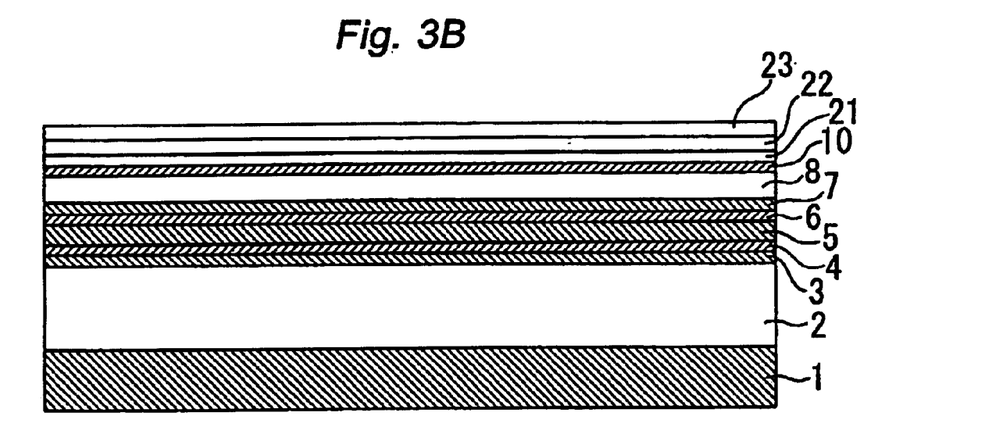

In the second step of FIG. 3B, the top of the p-type InP layer 21 is covered entirely with an $SiO_2$ insulation film 22. In turn, the $SiO_2$ insulation film 22 is topped with a resist film 23.

Figures 4A, 4B:
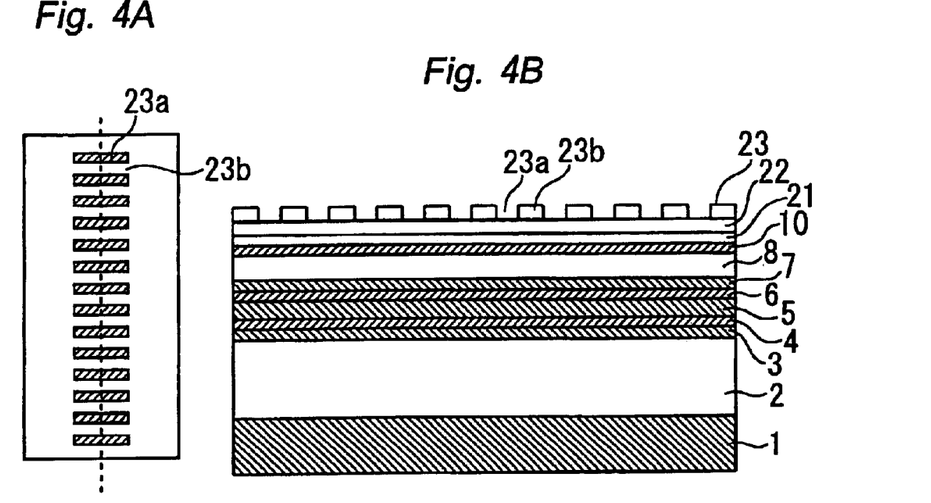

The third step of FIGS. 4A and 4B involves patterning the resist film 23 for grating formation. The pattern is pitched at intervals of about 2,000 Å in the extending direction of the ridge waveguide RW and is 10 µm wide perpendicularly to its extending direction. FIG. 4B shows a cross section of the ridge waveguide RW in its extending direction, and FIG. 4A is a top view of the ridge waveguide RW. With the resist 23 removed as indicated by reference numeral 23a, portions 23b of the resist 23 remain intact. The ridge waveguide RW is given a relatively large width of 10 µm perpendicularly to it extending direction; any width smaller than this would result in an irregular (i.e., inaccurate) pattern.

Figure 4C:
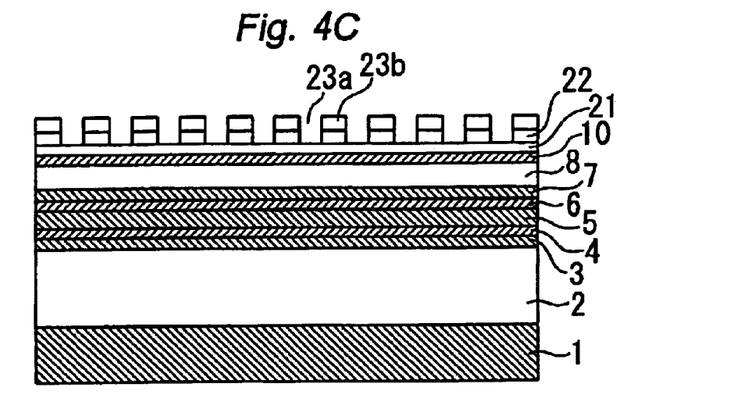

The fourth step in FIG. 4C involves dry-etching the $SiO_2$ insulation film 22 with the patterned resist film 23 used as a mask. The etching gas to be used in this process is illustratively $CHF_3/O_2$ gas.

Figure 4D:
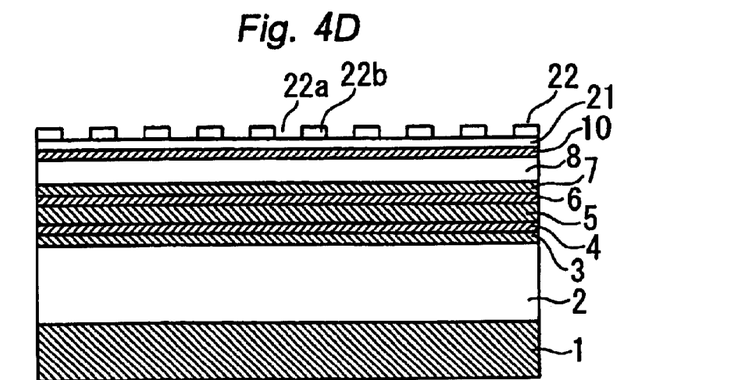

The fifth step in FIG. 4D involves removing the resist film 23. This step eliminates portions 22a from the $SiO_2$ insulation film 22 but leaves its portions 22b intact.

Figures 5A, 5B:
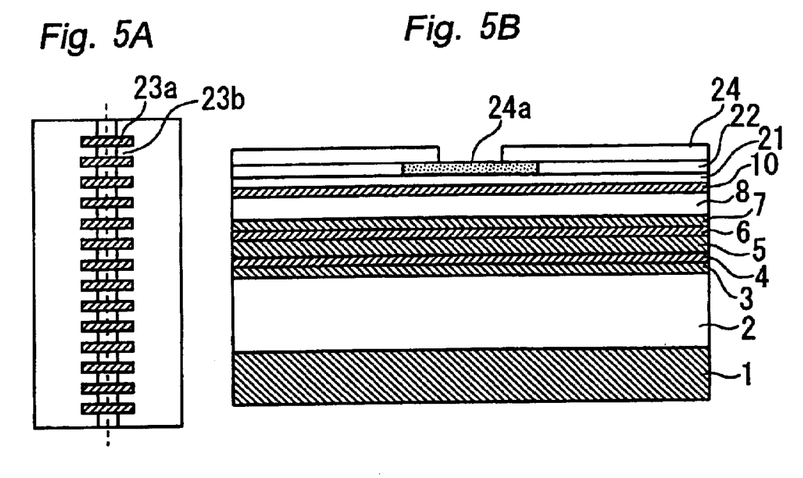

In the sixth step of FIGS. 5A and 5B, a resist film 24 is applied all over the $SiO_2$ insulation film 22. With the initially formed markers utilized for alignment purposes, a photolithographic process is carried out using a stepper whereby a ditch 24a is formed in the resist film 24. The ditch 24a has the same width as the ridge waveguide RW. Since the width of the ridge waveguide RW in perpendicular relation to its extending direction is as small as 1.8 µm, the ditch 24a is given the same width of 1.8 µm. The center of the ditch 24a is aligned with that of the width of the portions 22a from which the $SiO_2$ film 22 was removed. FIG. 5B shows a cross section of the ridge waveguide RW in its extending direction, and FIG. 5A is a top view of the ridge waveguide RW.

Figures 5C, 5D:
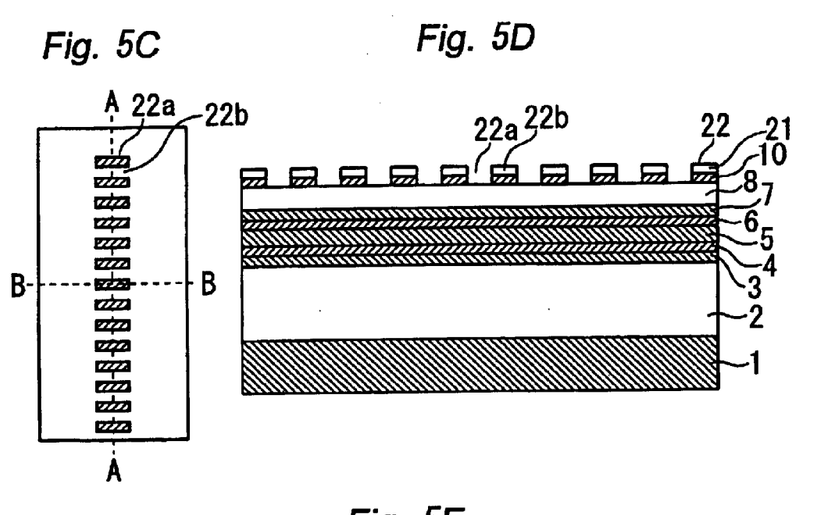
Figure 5E:
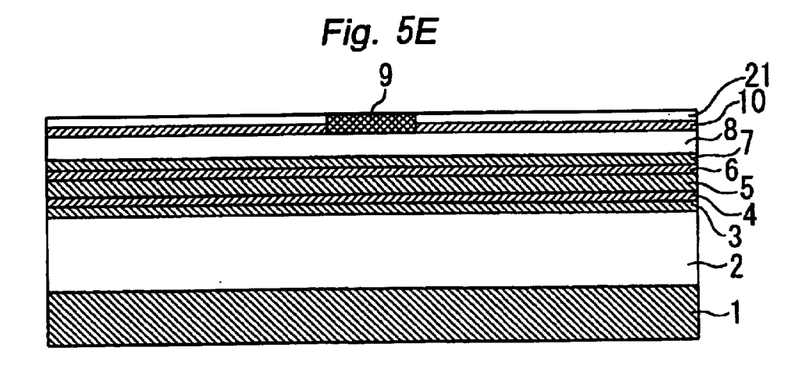

In the seventh step of FIGS. 5C, 5D and 5E, dry etching is performed on the lower p-type InP layer 21 from which the resist 24 and $SiO_2$ insulation film 22 were both removed and on the p-type InGaAsP layer 10 under the layer 21 by use of methane gas and hydrogen gas plasma, with the resist film 24 and $SiO_2$ insulation film 22 serving as a mask. The dry etching process forms the grating layer 9 having the same width as the ridge waveguide RW and pitched at intervals of about 2,000 Å. FIG. 5D shows a cross section of the ridge waveguide RW in its extending direction, and FIG. 5C is a top view of the ridge waveguide RW. FIG. 5E gives a cross section taken on line B—B in FIG. 5C.

Figure 6A:
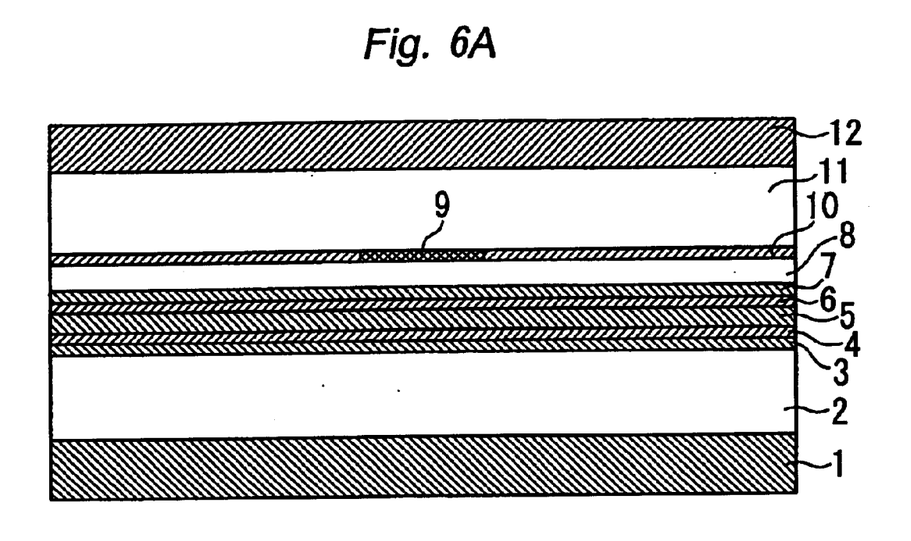

In the eighth step of FIG. 6A, the wafer is pre-treated in a sulfuric acid solution before having a p-type upper InP layer 11 and a p-type contact layer 12 formed on the grating layer 9 by buried growth. At this point, the initially formed alignment markers need to be covered with an $SiO_2$ film. This protective cover allows the markers to be used for alignment until the end of the whole process and thereby contributes to minimizing any misalignment in photolithography.

Figure 6B:
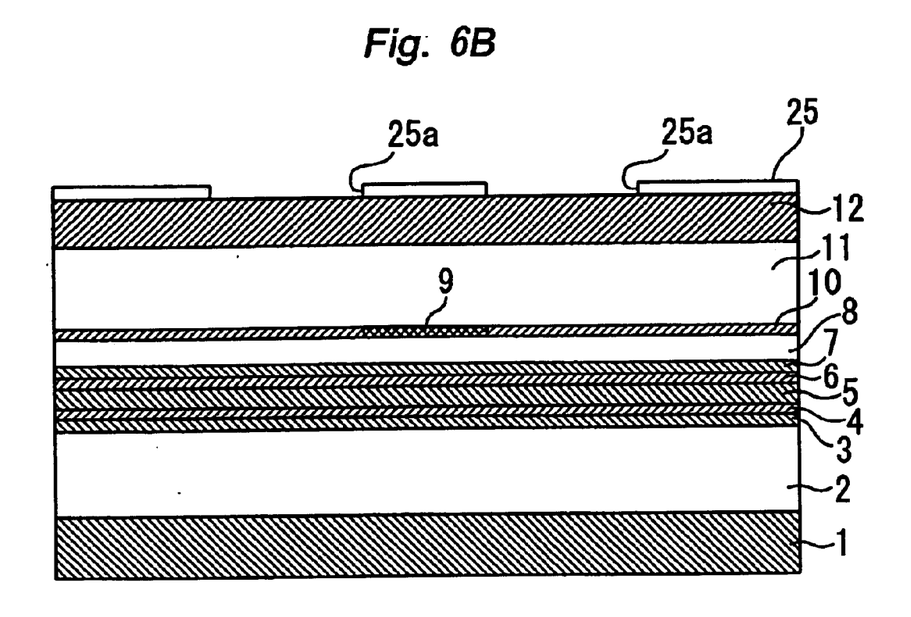

In the ninth step of FIG. 6B, the top of the wafer is covered entirely with an $SiO_2$ insulation film 25. Thereafter, openings 25a are etched in locations corresponding to the stripe ditches SD preparatory to ridge waveguide formation.

Figure 7A:
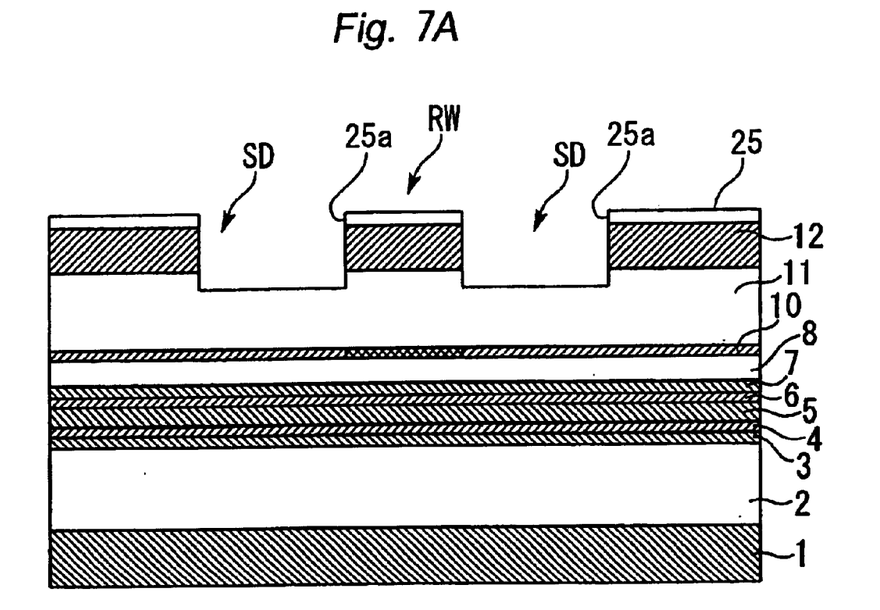

In the tenth step of FIG. 7A, the p-type contact layer 12 under the openings 25a is dry-etched all the way to the layer bottom using the $SiO_2$ insulation film 25 as a mask. The p-type upper InP layer 11 is then etched to some of its depth.

Figure 7B:
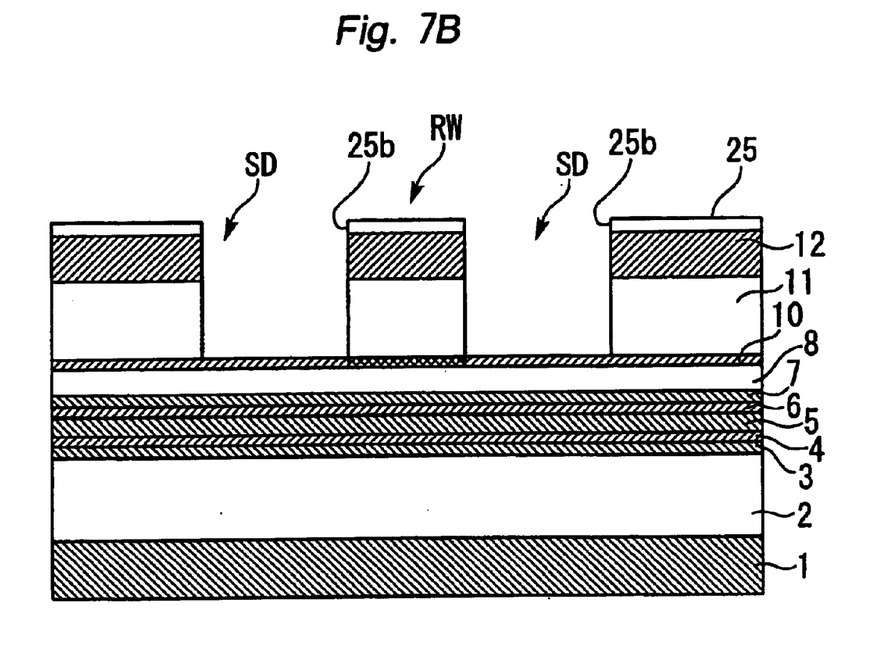

In the eleventh step of FIG. 7B, the p-type upper InP layer 11 is wet-etched all the way to its bottom, and the etching process is stopped at the p-type InGaAsP layer 10. A mixed solution of hydrochloric acid and phosphoric acid (1 part hydrochloric acid and 2 parts phosphoric acid), when used as the wet etching solution, has a high etching rate regarding the InP layer 11 but exhibits a very low etching rate with respect to the InGaAsP layer 10. This makes it possible to stop the etching process exactly at the p-type InGaAsP layer 10. Another characteristic of the wet etching process utilizing the mixed solution of hydrochloric acid and phosphoric acid is that the process advances downwards but shows little progress in the traverse direction. This permits formation of the ridge waveguide RW with vertical side walls.

Figure 8A:
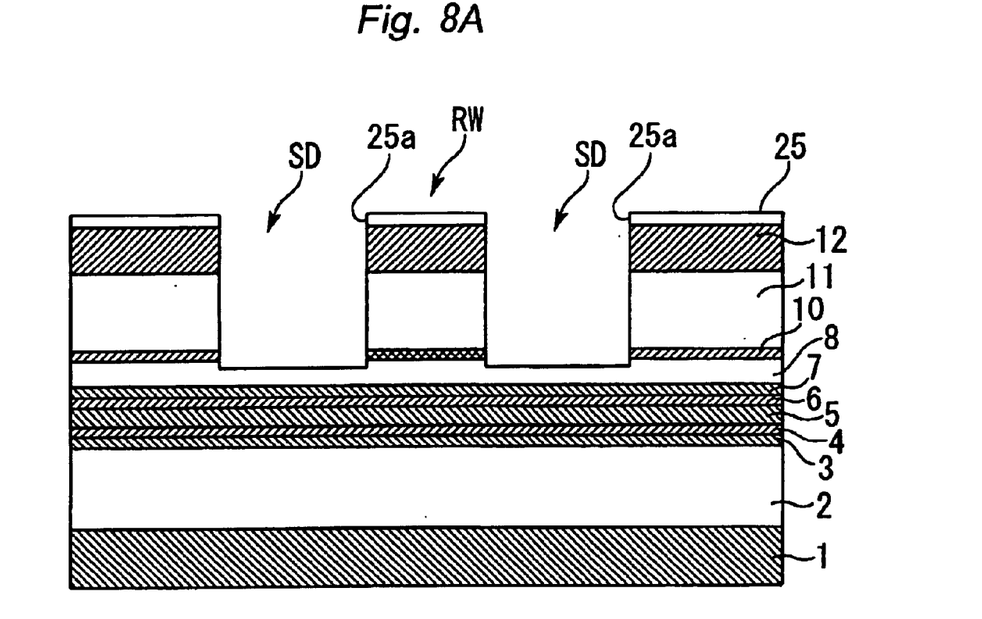

The twelfth step in FIG. 8A involves dry-etching the p-type InGaAsP layer 10 throughout its entire thickness and the p-type lower InP layer 8 to some part of its thickness using the $SiO_2$ insulation film 25 as a mask.

Figure 8B:
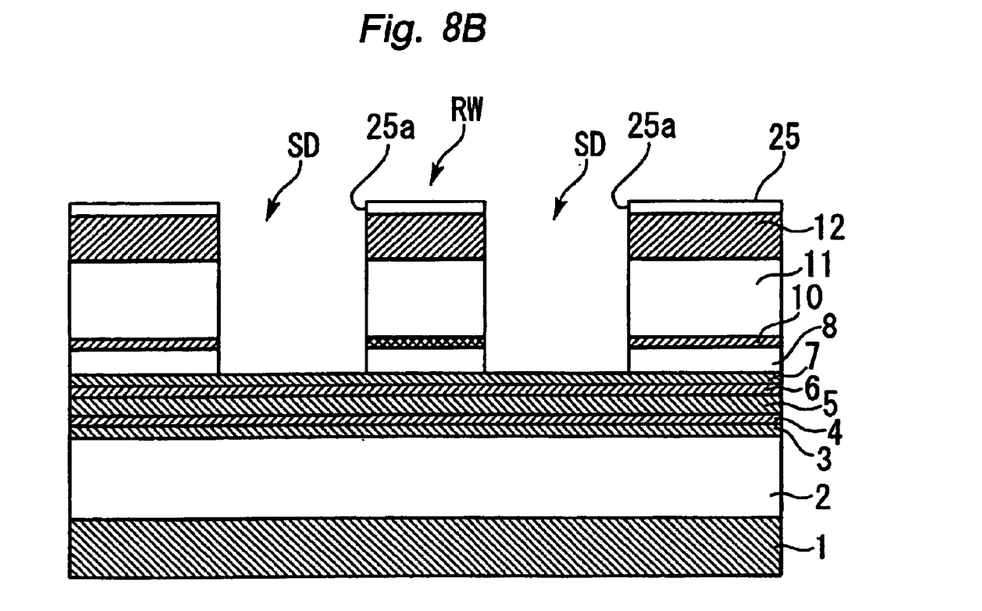

The thirteenth step in FIG. 8B involves wet-etching the p-type lower InP layer 8 all the way to its bottom and stopping the etching process at the p-type AlInAs layer 7. The wet-etching solution for this process is illustratively a mixed solution of hydrochloric acid and phosphoric acid.

Figure 9A:
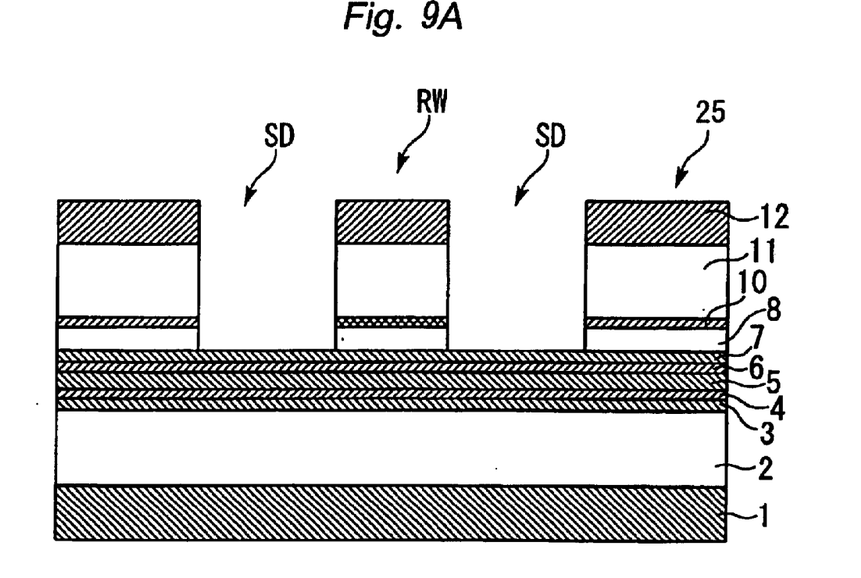

In the fourteenth step of FIG. 9A, the $SiO_2$ insulation film 25 is removed by etching.

Figure 9B:
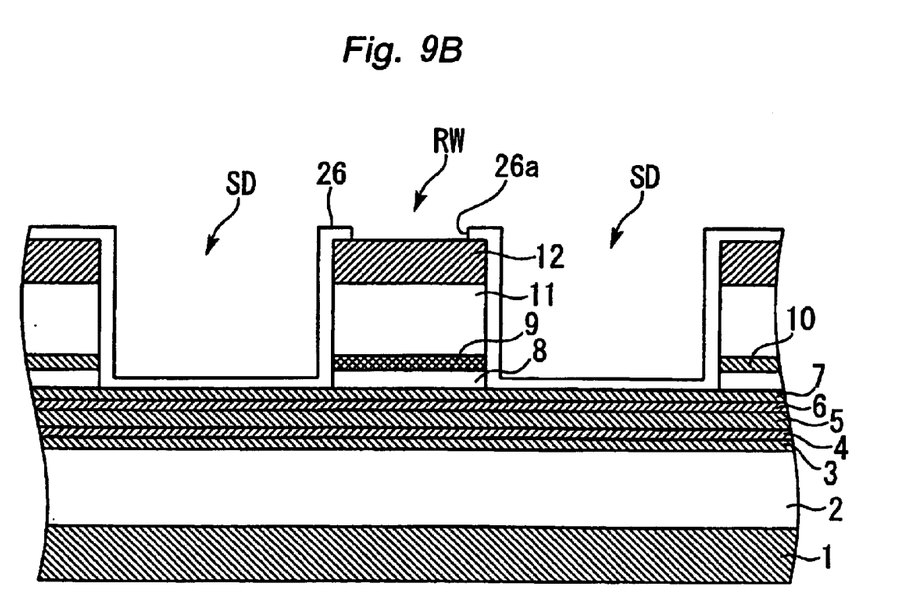

In the fifteenth step of FIG. 9B, an $SiO_2$ insulation film 26 is formed anew so as to cover the tops and sides of the ridges as well as the bottoms of the strip ditches SD. Thereafter, contact holes 26a are formed in the $SiO_2$ insulation film 26 on top of the ridge waveguide RW by means of photolithography.

Figure 10:
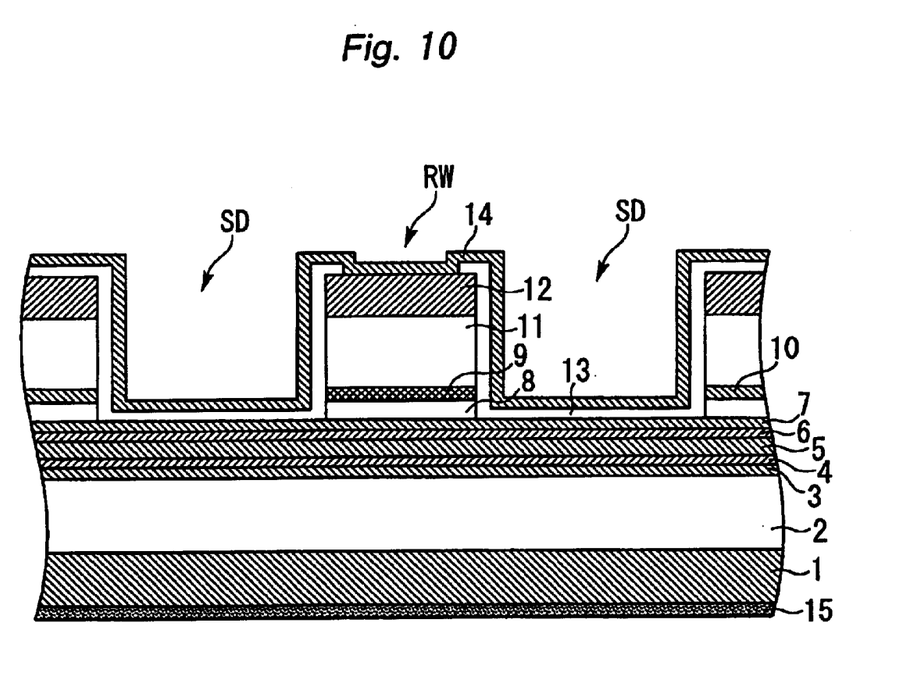

In the sixteenth step of FIG. 10, a p-type electrode 13 and an n-type electrode 14 of the laser are formed.

The first embodiment is characterized in that the p-type carrier density of the p-type InGaAsP grating layer 9 is raised to as high as between $1.5\times10^{18}$ $cm^{-3}$ and $4.0\times10^{18}$ $cm^{-3}$. Preferably, the p-type carrier density in the grating layer 9 should range from $2\times10^{18}$ $cm^{-3}$ to $3\times10^{18}$ $cm^{-3}$; for the first embodiment, the carrier density is set specifically to $2.5\times10^{18}$ $cm^{-3}$. The carrier density in the p-type InGaAsP grating layer of conventional lasers of the above-described kind was as low as $1.0\times10^{18}$ $cm^{-3}$ or even less.

An increased carrier density of the p-type InGaAsP grating layer 9 largely keeps zinc (Zn) from diffusing from the p-type InP layer 11 into the p-type InGaAsP grating layer 9, despite the high level of solid solubility of zinc in the InGaAsP layer 9. This prevents a drop in the density of zinc immediately above the InGaAsP grating layer 9, allowing zinc to compensate the piled-up silicon (Si) just above the p-type InGaAsP grating layer 9. With the silicon pileup compensated by zinc, the n-type layer residuals are removed from there so that any increase in laser resistance can be forestalled. Preferably, the p-type carrier density in the p-type InGaAsP grating layer 9 should be kept to a maximum of $4.0\times10^{18}$ $cm^{-3}$; an excessively high carrier density could degrade dielectric strength.

Figure 11:
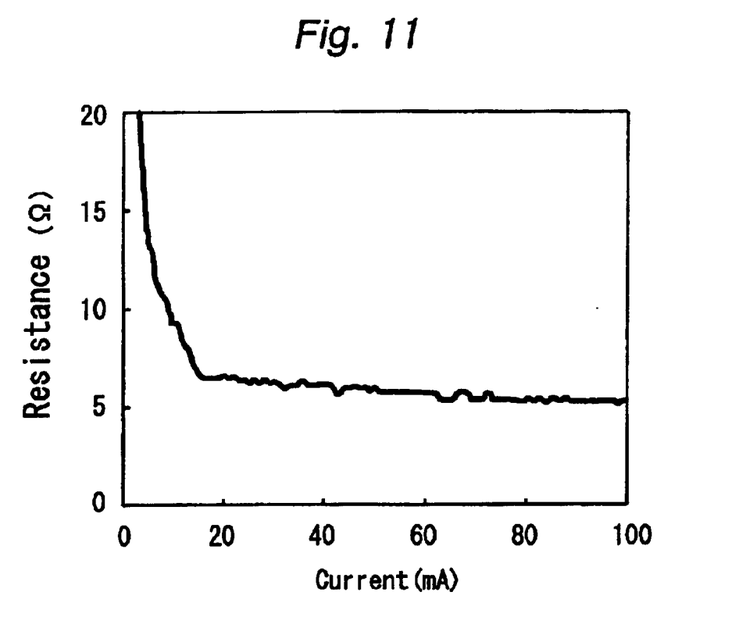
FIG. 11 shows typical current value dependence of laser resistance.

FIG. 11 shows typical current value dependence of laser resistance for the first embodiment of this invention. In FIG. 11, the axis of abscissa stands for values of a current (mA) that flows into the oscillation region, and the axis of ordinate denotes values of resistance ($\Omega$) in series with the current. As evident in FIG. 11, the series resistance is approximately as low as 6 $\Omega$ for a wide range of current values from 15 mA to 100 mA. More specifically, the resistance drops to 6 $\Omega$ when the current reaches 20 mA, which represents significant improvements in the temperature characteristic and high-speed operation characteristic of the laser.

Second Embodiment

A second embodiment of this invention involves having the p-type carrier density of the p-type InGaAsP grating layer 9 brought to $1.5\times10^{18}$ $cm^{-3}$ through $4.0\times10^{18}$ $cm^{-3}$ and preferably to $2.0\times10^{18}$ $cm^{-3}$ through $3.0\times10^{18}$ $cm^{-3}$, and having the p-type carrier density of the upper and lower p-type InP layers 8 and 11 set to $1.5\times10^{18}$ $cm^{-3}$ through $4.0\times10^{18}$ $cm^{-3}$ and preferably to $2.0\times10^{18}$ $cm^{-3}$ through $3.0\times10^{18}$ $cm^{-3}$. Specifically for the second embodiment, the carrier density of the InP layers 8 and 11 is set to $2.5\times10^{18}$ $cm^{-3}$. An increased carrier density in the InP layers 8 and 11 is effective in preventing any increase in the series resistance that could be brought about by the piled-up silicon (Si). When combined with the raised carrier density in the InGaAsP grating layer 9, the boosted carrier density in the layers 8 and 11 doubly ensures suppression of an n-type layer that could otherwise result from the silicon pileup. The same effect is obtained by raising to the above-described level the carrier density in at least one of the InP layers 8 and 11. The effect is also the same when the carrier density of the p-type InP layer 21 used in the first step of FIG. 3A through the seventh step of FIGS. 5C, 5D and 5E is brought to the same density as that of the InP layers 8 and 11.

As described, the ridge waveguide type semiconductor laser according to the invention has the p-type carrier density of the p-type InGaAsP grating layer kept between $1.5\times10^{18}$ $cm^{-3}$ and $4.0\times10^{18}$ $cm^{-3}$ and preferably between $2.0\times10^{18}$ $cm^{-3}$ and $3.0\times10^{18}$ $cm^{-3}$. The carrier density level thus raised prevents an upsurge of resistance that can be brought about by the silicon pileup stemming from buried growth of the p-type InGaAsP grating layer. With any rise in its series resistance forestalled, the inventive laser offers significant improvements in terms of temperature characteristic and high-speed operation characteristic.

In combination with the boosted carrier density in the InGaAsP grating layer, the p-type carrier density may be enhanced both in a p-type InP layer between the grating layer and a contact layer, and in another p-type InP layer between the grating layer and a quantum well active layer, the density ranging from $1.5\times10^{18}$ $cm^{-3}$ to $4.0\times10^{18}$ $cm^{-3}$ and preferably from $2.0\times10^{18}$ $cm^{-3}$ to $3.0\times10^{18}$ $cm^{-3}$. This inventive setup further makes sure that resistance upsurge due to the silicon pileup is prevented and thereby forestalls any increase in the series resistance of the laser.

It is further understood that the foregoing description is a preferred embodiment of the disclosed laser and that various changes and modifications may be made in the invention without departing from the spirit and scope thereof.

The entire disclosure of a Japanese Patent Application No. 2002-086567, filed on Mar. 26, 2002 including specification, claims drawings and summary, on which the Convention priority of the present application is based, are incorporated herein by reference in its entirety.

What is claimed is:

1. A ridge waveguide distributed feedback laser comprising:
an n-type semiconductor substrate on which a plurality of semiconductor layers are sequentially arranged, including
an n-type cladding layer,
an active layer, and
a p-type cladding layer;
a ridge waveguide disposed on the p-type cladding layer, the ridge waveguide including p-type first and second InP layers sandwiching a p-type InGaAsP grating layer, the second p-type InP layer being more remote from the p-type cladding layer than the first p-type InP layer and containing zinc, the p-type InGaAsP grating layer having a carrier density ranging from $1.5 \times 10^{18}$ cm$^{-3}$ to $4.0 \times 10^{18}$ cm$^{-3}$ for retarding diffusion of zinc from the second p-type InP layer into the p-type InGaAsP grating layer; and
first and second electrodes respectively in electrical communication with the substrate and the ridge waveguide.

2. The ridge waveguide distributed feedback laser according to claim 1, wherein the p-type InGaAsP grating layer has a carrier density ranging from $2.0 \times 10^{18}$ cm$^{-3}$ to $3.0 \times 10^{-3}$.

3. The ridge waveguide distributed feedback laser according to claim 1, wherein the ridge waveguide includes a p-type contact layer, and the second p-type InP layer has a carrier density ranging from $1.5 \times 10^{18}$ cm$^{-3}$ to $4.0 \times 10^{18}$ cm$^{-3}$ and is interposed between the p-type InGaAsP grating layer and the p-type contact layer.

4. The ridge waveguide distributed feedback laser according to claim 3, wherein
the p-type InGaAsP grating layer has a carrier density ranging from $2.0 \times 10^{18}$ cm$^{-3}$ to $3.0 \times 10^{18}$ cm$^{-3}$, and
the second p-type InP layer has a carrier density ranging from $2.0 \times 10^{18}$ cm$^{-3}$ to $3.0 \times 10^{18}$ cm$^{-3}$.

5. The ridge waveguide distributed feedback laser according to claim 1, wherein
the active layer has a quantum well structure, and
the first p-type InP layer has a carrier density ranging from $1.5 \times 10^{18}$ cm$^{-3}$ to $4.0 \times 10^{18}$ cm$^{-3}$.

6. The ridge waveguide distributed feedback laser according to claim 5, wherein
the p-type InGaAsP grating layer has a carrier density ranging from $2.0 \times 10^{18}$ cm$^{-3}$ to $3.0 \times 10^{18}$ cm$^{-3}$, and
the first p-type InP layer has a carrier density ranging from $2.0 \times 10^{18}$ cm$^{-3}$ to $3.0 \times 10^{18}$ cm$^{-3}$.

7. The ridge waveguide distributed feedback laser according to claim 1, wherein the first and second p-type InP layers sandwiching the p-type InGaAsP grating layer, have carrier densities ranging from $1.5 \times 10^{18}$ cm$^{-3}$ to $4.0 \times 10^{18}$ cm$^{-3}$.

8. The ridge distributed feedback laser according to claim 7, wherein the p-type grating layer has a carrier density ranging from $2.0 \times 10^{18}$ to $3.0 \times 10^{18}$ cm$^{-3}$, and each of the first and second p-type InP layers has a carrier density ranging from $2.0 \times 10^{18}$ to $3.0 \times 10^{18}$ cm$^{-3}$.

* * * * *